US008824616B1

(12) United States Patent
Gopalakrishnan

(10) Patent No.: US 8,824,616 B1
(45) Date of Patent: Sep. 2, 2014

(54) CMOS INTERPOLATOR FOR A SERIALIZER/DESERIALIZER COMMUNICATION APPLICATION

(71) Applicant: Inphi Corporation, Santa Clara, CA (US)

(72) Inventor: Karthik S. Gopalakrishnan, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 0 days.

(21) Appl. No.: 13/802,248

(22) Filed: Mar. 13, 2013

Related U.S. Application Data

(60) Provisional application No. 61/617,896, filed on Mar. 30, 2012.

(51) Int. Cl.
*H03D 3/24* (2006.01)
(52) U.S. Cl.
USPC ............................................... 375/376
(58) Field of Classification Search
CPC ...... H04L 7/033; H04L 7/0337; H04L 7/0025
USPC ................................................ 375/376
See application file for complete search history.

(56) References Cited

U.S. PATENT DOCUMENTS

| | | | | |
|---|---|---|---|---|
| 5,122,689 A * | 6/1992 | Barre | ............................. | 326/73 |
| 7,020,227 B1 * | 3/2006 | Wang et al. | .................... | 375/355 |
| 8,116,418 B2 * | 2/2012 | Chien | ........................... | 375/373 |
| 8,164,493 B2 * | 4/2012 | Hsieh | ............................ | 341/110 |
| 8,228,110 B1 * | 7/2012 | Song et al. | .................... | 327/359 |
| 8,395,446 B1 | 3/2013 | Tran | | |
| 2007/0121711 A1 | 5/2007 | Offord et al. | | |
| 2007/0146014 A1 * | 6/2007 | Cheung | .......................... | 327/20 |
| 2009/0304054 A1 | 12/2009 | Tonietto et al. | | |
| 2012/0189086 A1 | 7/2012 | Cai et al. | | |
| 2013/0207707 A1 * | 8/2013 | Agrawal et al. | ............... | 327/237 |

OTHER PUBLICATIONS

Office Action for U.S. Appl. No. 13/802,620, dated Feb. 21, 2014.

* cited by examiner

*Primary Examiner* — Juan A Torres
(74) *Attorney, Agent, or Firm* — Richard T. Ogawa; Ogawa P.C.

(57) ABSTRACT

In an example, the phase interpolator (PI) is provided to adjust the phase of a clock such that the phase is aligned to an incoming data pattern from a data stream. The data can be captured from a device such as a flip-flop or the like. The present technique uses a PI (digital to phase) and a digital state machine in a feedback loop to set the correct digital code to the PI inputs to achieve an appropriate clock phase. Of course, there can be variations.

19 Claims, 6 Drawing Sheets

FIGURE 3A

| Dec Code | T2 | T1 | T0 | B2 | B1 | B0 | PHASE |
|---|---|---|---|---|---|---|---|
| 0 | 0 | 0 | 0 | 0 | 0 | 0 | 0 |
| 1 | 0 | 0 | 0 | 0 | 0 | 1 | 5.625 |
| 2 | 0 | 0 | 0 | 0 | 1 | 0 | 11.25 |
| 3 | 0 | 0 | 0 | 0 | 1 | 1 | 16.875 |
| 4 | 0 | 0 | 1 | 0 | 0 | 0 | 22.5 |
| 5 | 0 | 0 | 1 | 0 | 0 | 1 | 28.125 |
| 6 | 0 | 0 | 1 | 0 | 1 | 0 | 33.75 |
| 7 | 0 | 0 | 1 | 0 | 1 | 1 | 39.375 |
| 8 | 0 | 1 | 1 | 0 | 0 | 0 | 45 |
| 9 | 0 | 1 | 1 | 0 | 0 | 1 | 50.625 |
| 10 | 0 | 1 | 1 | 0 | 1 | 0 | 56.25 |
| 11 | 0 | 1 | 1 | 0 | 1 | 1 | 61.875 |
| 12 | 1 | 1 | 1 | 0 | 0 | 0 | 67.5 |
| 13 | 1 | 1 | 1 | 0 | 0 | 1 | 73.125 |
| 14 | 1 | 1 | 1 | 0 | 1 | 0 | 78.75 |
| 15 | 1 | 1 | 1 | 0 | 1 | 1 | 84.375 |
| 16 | 1 | 1 | 1 | 1 | 1 | 1 | 90 |
| 17 | 1 | 1 | 1 | 0 | 1 | 1 | 95.625 |
| 18 | 1 | 1 | 1 | 0 | 1 | 0 | 101.25 |
| 19 | 1 | 1 | 1 | 0 | 0 | 1 | 106.875 |
| 20 | 1 | 1 | 1 | 0 | 0 | 0 | 112.5 |
| 21 | 1 | 1 | 0 | 0 | 1 | 1 | 118.125 |
| 22 | 1 | 1 | 0 | 0 | 1 | 0 | 123.75 |
| 23 | 1 | 1 | 0 | 0 | 0 | 1 | 129.375 |
| 24 | 1 | 1 | 0 | 0 | 0 | 0 | 135 |
| 25 | 1 | 0 | 0 | 0 | 1 | 1 | 140.625 |
| 26 | 1 | 0 | 0 | 0 | 1 | 0 | 146.25 |
| 27 | 1 | 0 | 0 | 0 | 0 | 1 | 151.875 |
| 28 | 1 | 0 | 0 | 0 | 0 | 0 | 157.5 |
| 29 | 0 | 0 | 0 | 0 | 1 | 1 | 163.125 |
| 30 | 0 | 0 | 0 | 0 | 1 | 0 | 168.75 |
| 31 | 0 | 0 | 0 | 0 | 0 | 1 | 174.375 |
| 32 | 0 | 0 | 0 | 0 | 0 | 0 | 180 |
| 33 | 0 | 0 | 0 | 0 | 0 | 1 | 185.625 |
| 34 | 0 | 0 | 0 | 0 | 1 | 0 | 191.25 |

| | | | | | | | |
|---|---|---|---|---|---|---|---|
| 35 | 0 | 0 | 0 | 0 | 1 | 1 | 196.875 |
| 36 | 0 | 0 | 0 | 0 | 0 | 0 | 202.5 |
| 37 | 0 | 0 | 1 | 0 | 0 | 1 | 208.125 |
| 38 | 0 | 0 | 1 | 0 | 1 | 0 | 213.75 |
| 39 | 0 | 0 | 1 | 0 | 1 | 1 | 219.375 |
| 40 | 0 | 0 | 1 | 0 | 0 | 0 | 225 |
| 41 | 0 | 1 | 1 | 0 | 0 | 1 | 230.625 |
| 42 | 0 | 1 | 1 | 0 | 1 | 0 | 236.25 |
| 43 | 0 | 1 | 1 | 0 | 1 | 1 | 241.875 |
| 44 | 0 | 1 | 1 | 0 | 0 | 0 | 247.5 |
| 45 | 1 | 1 | 1 | 0 | 0 | 1 | 253.125 |
| 46 | 1 | 1 | 1 | 0 | 1 | 0 | 258.75 |
| 47 | 1 | 1 | 1 | 0 | 1 | 1 | 264.375 |
| 48 | 1 | 1 | 1 | 1 | 1 | 1 | 270 |
| 49 | 1 | 1 | 1 | 0 | 1 | 1 | 275.625 |
| 50 | 1 | 1 | 1 | 0 | 1 | 0 | 281.25 |
| 51 | 1 | 1 | 1 | 0 | 0 | 1 | 286.875 |
| 52 | 1 | 1 | 1 | 0 | 0 | 0 | 292.5 |
| 53 | 1 | 1 | 0 | 0 | 1 | 1 | 298.125 |
| 54 | 1 | 1 | 0 | 0 | 1 | 0 | 303.75 |
| 55 | 1 | 1 | 0 | 0 | 0 | 1 | 309.375 |
| 56 | 1 | 1 | 0 | 0 | 0 | 0 | 315 |
| 57 | 1 | 0 | 0 | 0 | 1 | 1 | 320.625 |
| 58 | 1 | 0 | 0 | 0 | 1 | 0 | 326.25 |
| 59 | 1 | 0 | 0 | 0 | 0 | 1 | 331.875 |
| 60 | 1 | 0 | 0 | 0 | 0 | 0 | 337.5 |
| 61 | 0 | 0 | 0 | 0 | 1 | 1 | 343.125 |
| 62 | 0 | 0 | 0 | 0 | 1 | 0 | 348.75 |
| 63 | 0 | 0 | 0 | 0 | 0 | 1 | 354.375 |
| 64 | 0 | 0 | 0 | 0 | 0 | 0 | 360 |

CMOS INTERPOLATOR FOR A SERIALIZER/DESERIALIZER COMMUNICATION APPLICATION

CROSS-REFERENCE TO RELATED APPLICATIONS

The present application claims priority to U.S. Ser. No. 61/617,896 filed Mar. 30, 2012, commonly assigned, and hereby incorporated by reference herein.

BACKGROUND OF THE INVENTION

The present invention relates generally to integrated circuits. More particularly, the present invention provides a circuit and method for a CMOS interpolator for an output clock signal with a desirable phase for a high speed serializer/deserializer device. But it will be recognized that the technique can be used for regulating memory devices (e.g., DDR 4 SDRAM devices, DDR4 register devices, DDR4 controller devices), and other high speed data applications.

As integrated circuits are designed to operate at increasingly higher frequencies, noisy, distorted, and/or inconsistent signals can cause devices such as output drivers to produce poor quality output. Preferably, an output driver may provide a clean, symmetric, well-shaped output waveform even if the input signals are noisy or of poor quality. However, a driver may receive an asymmetric, low quality differential signal with a substantial and/or inconsistent amplitude variation and/or a common mode component. In many cases, the quality of the differential input signal may degrade with increased operating frequency. An eye diagram, constructed by overlaying the output voltage waveforms for many clock cycles, may be used indicate the fidelity or quality of a signal put through an electronic buffer circuit. A high quality output waveform may have an eye diagram with a symmetric shape that approaches the shape of a square wave. Often, it is desirable to have an output waveform with a centered or controllable crossing point (the point where the rising and falling signals intersect). The output crossing point may be characterized by the crossing point voltage. For a differential output, each of the output waveforms has an associated crossing point voltage.

From the above, it is seen that techniques for improving output waveforms and regulating them are highly desirable.

BRIEF SUMMARY OF THE INVENTION

The present invention relates generally to integrated circuits. The present invention relates generally to integrated circuits. More particularly, the present invention provides a circuit and method for a CMOS interpolator for an output clock signal with a desirable phase for a high speed serializer/deserializer device. But it will be recognized that the technique can be used for regulating memory devices (e.g., DDR 4 SDRAM devices, DDR4 register devices, DDR4 controller devices), and other high speed data applications. Additionally, such techniques can be used for a variety of applications such as network and/or computer storage systems, computer servers, hand held computing devices, portable computing devices, computer systems, network appliances and/or switches, routers, and gateways, and the like.

In an example, the present phase interpolator (PI) mixes two clock signals as desirable to provide an output clock signal having a desirable phase. The output phase depends upon a weighting given to each of the input clock signals. As an example, the input clock signals are two square waves separated by 90 Degrees, in an application, although there may be variations. In an example, the PI can also be configured to provide a digital code to-phase converter, called D2P. That is, a digital word sets a weighting function that allows the output phase of the PI with respect to inputs to be changed and/or varied. Using two square waves at 0, 90 Degrees phase relationship between edges as an example, the PI produces an output that can be varied from 0 Degrees as the digital code is changed.

In an example, the PI is provided to adjust the phase of a clock such that the phase is aligned to an incoming data pattern from a data stream. The data can be captured from a device such as a flip-flop or the like. The PI in this example is for clock recovery, which can be done conventionally using an analog phase locked loop, PLL. The present technique uses a PI (digital to phase) and a digital state machine (or programmable and/or logical module to provide and maintain information) in a feedback loop to set the correct digital code to the PI inputs to achieve an appropriate clock phase. Of course, there can be variations.

In an example, the present a phase interpolator device comprises a first PI core and a second PI core coupled to the first PI core. As shown, the first PI core is configured to interpolate from a first rising edge from a first clock and a second rising edge from a second clock. In an example, the second PI core being configured to interpolate from a third rising edge from a third clock and a fourth rising edge from a fourth clock, where the terms first, second, third, and fourth do not necessary imply order. In an example, the device has a first set of multiplexers coupled to a first input of the first PI core and a second set of multiplexers coupled to second input of the second PI core. In an example, the device also has an SR latch device comprising an set (S) input and a reset R input. In an example, the S input is coupled to the second PI core that controls the R input. The output of the latch device comprises a Y and Y-Bar output. In an example, the device has an input for a digital word, where the input is coupled to the first PI core and the second PI core. Preferably, the Y and Y-Bar output of the latch device is operably responsive to each rising edge of the S input and the R input to output a clock signal having a fifty percent duty cycle on the Y and Y-Bar output.

In an example, the present invention provides a method of operating a telecommunication device. The method includes transferring a first clock signal and a second clock signal to a first PI core coupled to a second PI core. The first PI core is configured to interpolate from a first rising edge from the first clock signal and a second rising edge from the second clock signal. The method includes transferring a third clock signal and a fourth clock signal to the second PI core, which is configured to interpolate from a third rising edge from the third clock signal and a fourth rising edge from the fourth clock signal. The method also includes transferring information from the first PI core to an S input of an SR latch device and transferring information from the second PI core to an R input of the SR latch device. The method includes transferring a digital word to the first PI core and the second PI core and outputting a clock signal having a fifty percent duty cycle on the Y and Y-Bar from the latch device responsive to each rising edge of the S input and the R input. Of course, there can be variations.

In an example, the present invention provides an integrated transceiver circuit device. The device has a plurality of receivers coupled to a plurality of channels. Each of the channels is configured for transmitting asynchronous data to one of the receivers. Each of the receivers has a pre-amplifier device having an input and an output. The input is coupled to a channel associated with the receiver. The device has a comparator device comprising an input coupled to the pre-amplifier, and configured to identify one or more binary states, and a phase interpolator device coupled to a receiver of the comparator device. The phase interpolator device is configured to perform a digital to phase conversion using information from the one or more binary states. The phase interpolator device comprises a first PI core and a second PI core coupled to the first PI core, a first set of multiplexers coupled to a first input of the first PI core and a second set of multiplexers coupled to second input of the second PI core, and a latch device comprising an set (S) input and a reset R input, the S input being coupled to the second PI core that controls the R input. In an example, the latch device comprises a Y and Y-Bar output. The device also has an input for a digital word, the input being coupled to the first PI core and the second PI core. The device has a clock data recovery (CDR) device coupled to an output of the comparator device and configured to drive the phase interpolator device to synthesize a frequency and phase of a signal from the output. The device has a PLL device, the PLL device being common to and being coupled to each of the phase interpolator devices.

Benefits are achieved over conventional techniques. Depending upon the specific embodiment, one or more of these benefits may be achieved. In an example, the invention provides an efficient interpolator device configured for high speed communication devices. The invention can be implemented using conventional CMOS technologies, or the like. Of course, there can be other variations, modifications, and alternatives.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 3A is a table of thermo settings according to an embodiment of the present invention.

DETAILED DESCRIPTION OF THE INVENTION

The present invention relates generally to integrated circuits. More particularly, the present invention provides a circuit and method for regulating a voltage for a high speed serializer/deserializer (SerDes) device. But it will be recognized that the technique can be used for regulating memory devices (e.g., DDR 4 SDRAM devices, DDR4 register devices, DDR4 controller devices), and other high speed data applications. Additionally, such techniques can be used for a variety of applications such as network and/or computer storage systems, computer servers, hand held computing devices, portable computing devices, computer systems, network appliances and/or switches, routers, and gateways, and the like.

Figure 1:
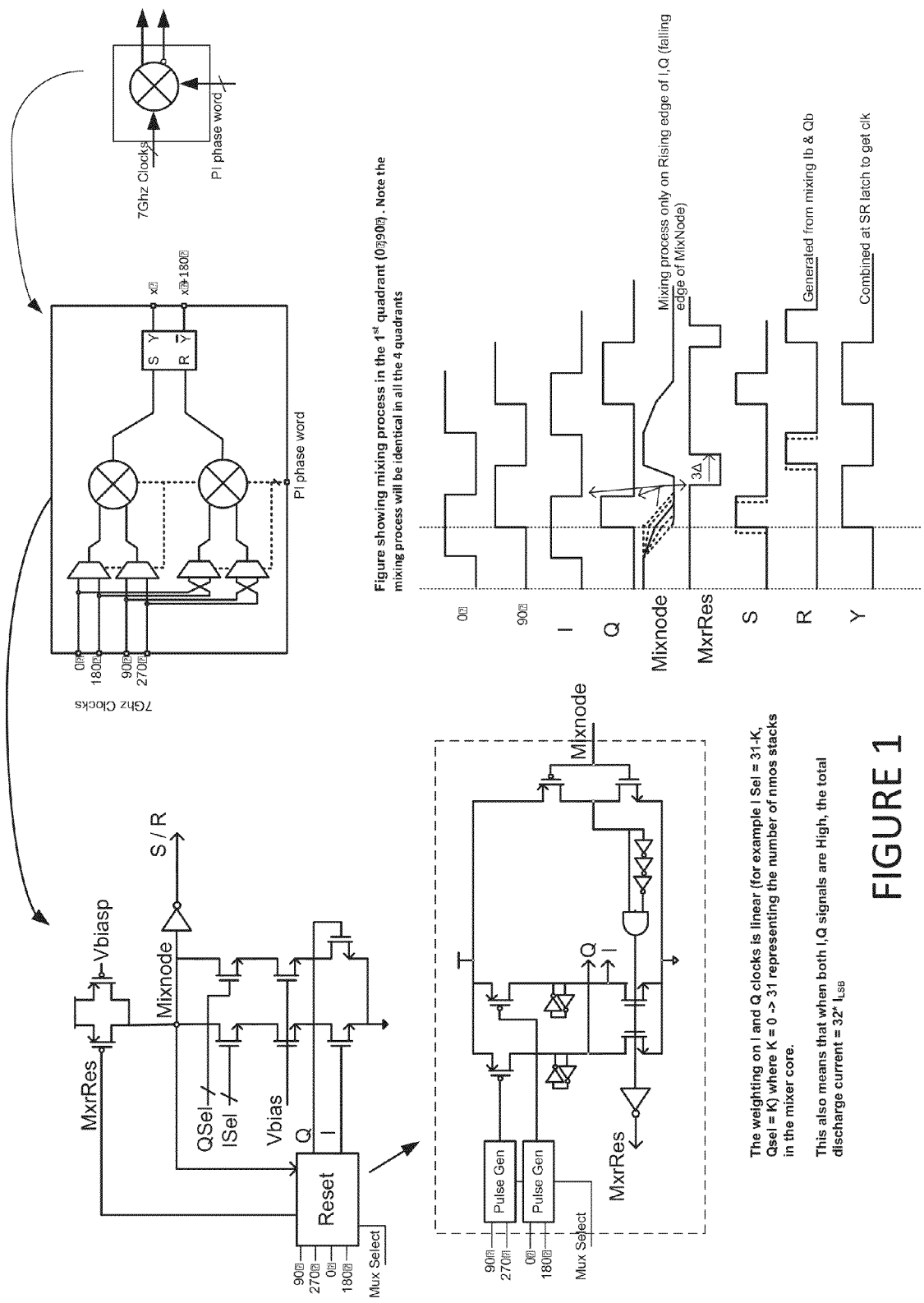
FIG. 1 is a simplified block diagram of a phase interpolator device according to an embodiment of the present invention.

FIG. 1 is a simplified block diagram of a phase interpolator device according to an embodiment of the present invention. In an example, the present a phase interpolator device comprises a first PI core and a second PI core coupled to the first PI core. As shown, the first PI core is configured to interpolate from a first rising edge from a first clock and a second rising edge from a second clock. In an example, the second PI core being configured to interpolate from a third rising edge from a third clock and a fourth rising edge from a fourth clock, where the terms first, second, third, and fourth do not necessary imply order. In an example, the device has a first set of multiplexers coupled to a first input of the first PI core and a second set of multiplexers coupled to second input of the second PI core.

In an example, the device also has an SR latch device comprising an set (S) input and a reset R input. In an example, the S input is coupled to the second PI core that controls the R input. The output of the latch device comprises a Y and Y-Bar output. In an example, the device has an input for a digital word, where the input is coupled to the first PI core and the second PI core. Preferably, the Y and Y-Bar output of the latch device is operably responsive to each rising edge of the S input and the R input to output a clock signal having a fifty percent duty cycle on the Y and Y-Bar output.

In an example, the present invention provides a method of operating a telecommunication device. The method includes transferring a first clock signal and a second clock signal to a first PI core coupled to a second PI core. The first PI core is configured to interpolate from a first rising edge from the first clock signal and a second rising edge from the second clock signal. The method includes transferring a third clock signal and a fourth clock signal to the second PI core, which is configured to interpolate from a third rising edge from the third clock signal and a fourth rising edge from the fourth clock signal. The method also includes transferring information from the first PI core to an S input of an SR latch device and transferring information from the second PI core to an R input of the SR latch device. The method includes transferring a digital word to the first PI core and the second PI core and outputting a clock signal having a fifty percent duty cycle on the Y and Y-Bar from the latch device responsive to each rising edge of the S input and the R input. Of course, there can be variations.

In an example, the each of the first PI core and the second PI core is characterized by a resetting characteristic by a reset pulse during a conclusion of a mixing operation. Additionally, the input for the digital word is coupled to a digital logic generator configured to be asynchronously timed with the digital logic generator and each of the first PI core and the second PI core. Further details of the present techniques can be found throughout the present specification and more particularly below.

Figure 2:
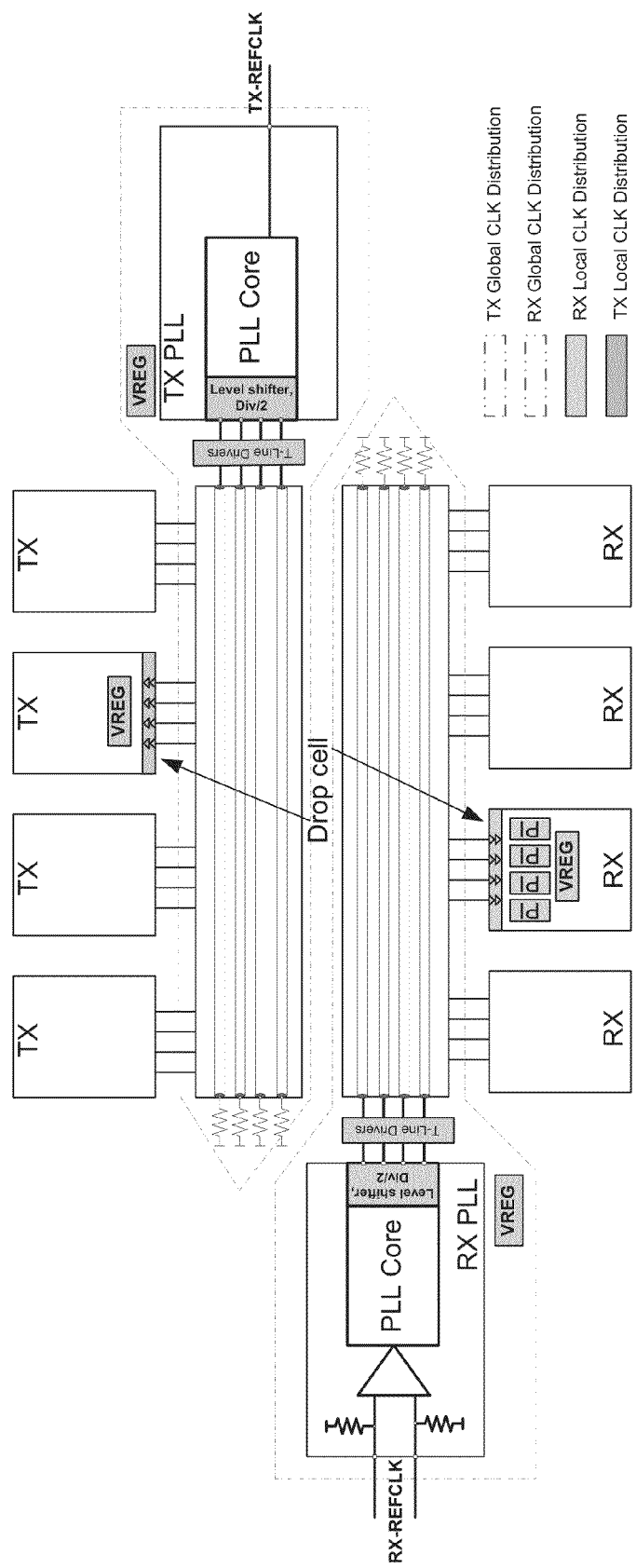
FIG. 2 is a simplified illustration of a transmitter and receiver configuration including the phase interpolator devices an embodiment of the present invention.

FIG. 2 is a simplified illustration of a transmitter and receiver configuration including the phase interpolator devices an embodiment of the present invention. As shown, the illustration includes a plurality of TX and RX modules, for transmit and receive processes. The illustration has line drivers, each corresponding to a plurality of channels. Each of the RX modules can include a plurality of receivers, as described, and phase interpolator devices configured to provide output signals based upon a binary word or input. Of course, there can be other variations, modifications, and alternative.

Figure 3:
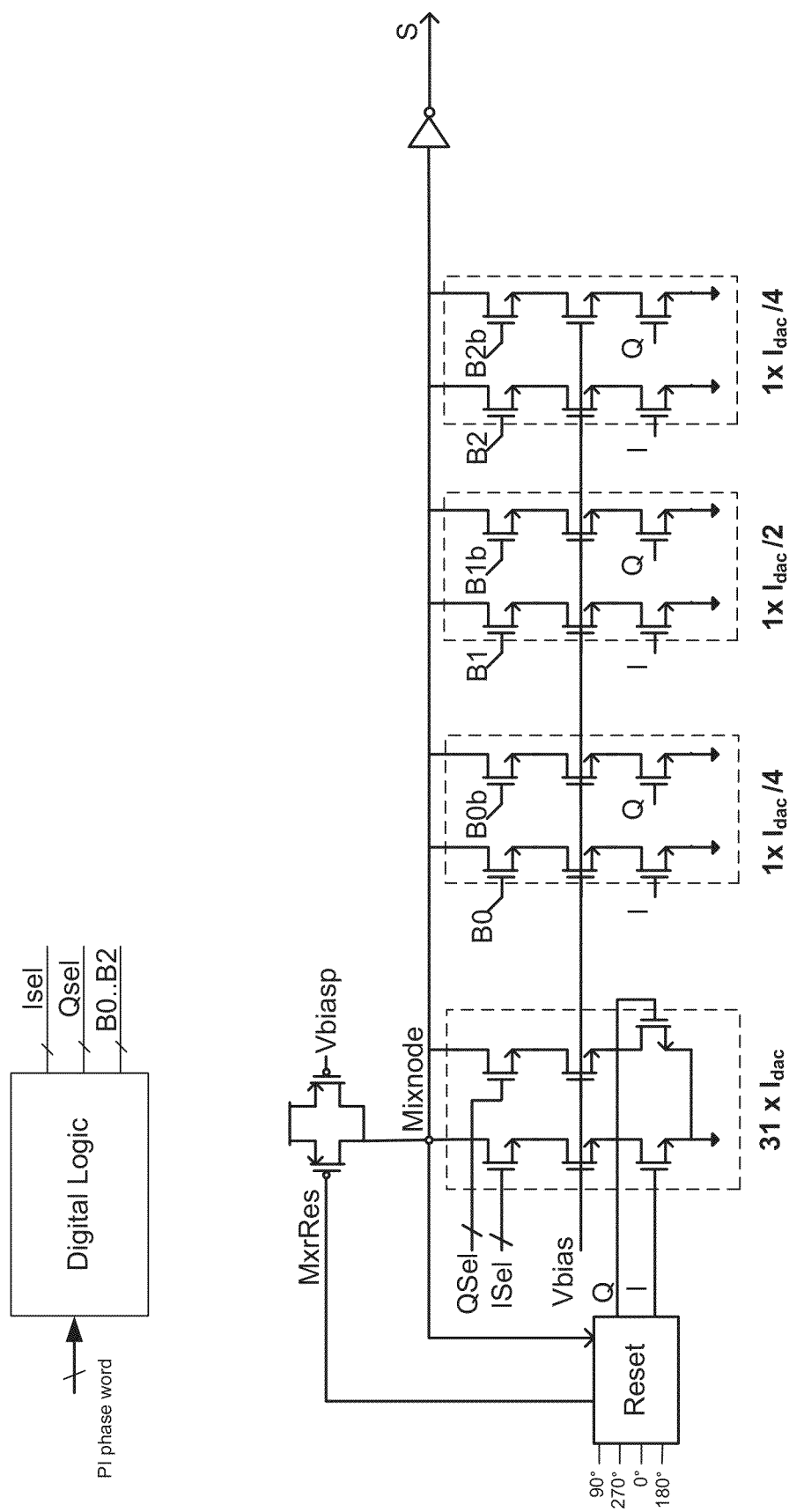
FIG. 3 is a simplified block diagram of a thermo setting configuration according to an embodiment of the present invention.

In an example, the present interpolator includes a mixer that mixes between two (2) clocks spaced 90° apart based on its 32 bit thermo setting, which has been described in more detail in FIGS. 1 and 3. The mixing process happens only on the rising edges of the input clock, which is performed to ensure rise to fall delay variations or duty cycle do not impact the performance of the mixer and do not contribute to the clock un-certainty at the end user in an example. As shown are the following techniques, in reference to the Figures:

2 sets of 2:1 multiplexers are included per PI core to ensure the mixer can select clocks from all 4 quadrants;

A PI Core controls the Set input of the SR latch and creates the rising edge of the True clock (rise mixer);

Another PI Core controls the Reset input of the SR latch and creates the rising edge of the Complement clock (fall mixer);

The two PI Core's use the same digital word, except that their input clocks pertain to opposite quadrants 180° apart. Thus the set input and reset input to the SR latch are 180° apart. Also the output of each core is a pulse whose width is <<180° and ensures non-overlapping inputs to the SR Latch.

In an example, the mixing process in this architecture uses an I/C mixing (i.e discharging by a fixed current). The mixer is assumed to be at a high state (mixnode) by the time rising edge of clocks arrive (I, Q). The total mixer discharge current is always fixed (Ilsb*128 where Ilsb=Idac/4). In an example, the mixer word allocates a fixed % of this current to I and the rest to the Q. For example a 100% weight on I or Q would start the discharge process as soon as the rising edge of that respective clock arrives.

A 50% weight would half this discharge current until both rising edges are seen when the discharge current reaches the total current of the DAC. Therefore, based on this weighting, a time dependent discharge rate is obtained which creates a delay which is a very linear function of the weighting factor (digital word). Whenever mixing node reaches a certain threshold low, the mixer generates a pulse that resets the input clocks to a low and the mixer core to a high state ready for the next mixing cycle. As shown in the Figure, the waveforms are shown for clarity and illustrative purposes.

It is possible for the reset signal to come too quickly and create a narrow pulse at the pi output. To mitigate this condition, a higher threshold on the inverter that drives the SR latch is used and the delay in the reset path also helps a valid high state develops at the inverter output. The reset also ensures that the output of the pi has a pulse width that is less than 180 Degrees.

Because of the pulsed nature of the PI, especially the reset, the mixer needs to be initialized on start up (mixnode→Vdd, I, Q→vss). This sets the correct stable operating point for this self-resetting mixer. Since the clocks are active on start up by the time PI is enabled asynchronously. It is often difficult for the resets to self-heal and arrive at the correct stable operating condition. To avoid this problem, the mixer is always enabled with 100% weight on start up and then switched to its correct digital code.

In an example, there are also pulse generators present on the inputs which generates pulses<<180° at its outputs. The 2:1 multiplexer functionality is also included in the pulse generators itself. The reason for these are (one or more of): (1) make PI insensitive to duty cycle of the incoming clocks; (2) to be able to reset the mixer any time after mixing completes; (3) be able to asynchronously switch the input multiplexers without having to worry about the mixer core operation. Of course, there can be variations.

If the pulse generators are not used, the one would have to wait till both inputs clocks go low (i.e., overlapping low signal). This leaves with very little time for the reset circuitry (at 7 GHz, this is 17 ps) to perform the mixer reset. And also when the input multiplexers get switched, an overlapping low signal may not be present on both clocks for 1 cycle and creates a missing pulse. The above techniques avoid all or improve these limitations and make it insensitive to the inputs.

In an example, a static reset signal is provided to the SR latch to set it to the low state on start up. In an example, our result on the extracted version of the mixer shows the INL and DNL which are indicators of the mixer linearity, which is desirable.

In an example, the present techniques, and in particular the interpolator, use thermo codes, PI step size, and code skew as will be described in more detail throughout the present specification and more particularly below, and in reference to FIGS. 3 and 3A. The PI Core uses 31 thermometer weights and 3 binary weights for each for I and Q. Thus 31 Thermometer coded wires and its complement and 3 binary and complements are required to switch all the DAC weight from I to Q or Q to I. It is to be noted that though there are 3 binary bits, the 3rd binary bit has only a 1 LSB weight and is not a true b2 binary bit. This bit is introduced to only get an extra state to make the total PI codes an even number of steps (odd number of states) so that the quadrant is divided by an even number. The table below shows the example for a 3 thermo and 3 binary case of a phase interpolator rotator and can be extended to a 31 thermo rotator. Note the addition of B2 makes a 16 step rotator which otherwise would have had only 15 steps in the example. By extension, the technique achieves 28 steps from 31 thermo and the same 3 binary bits. In an example, thus the DAC enables 128 distinct steps (129 distinct levels or states). This sets the resolution or step-size of the phase interpolator. Also this makes it easy for the CDR arithmetic to space the phase interpolator to get quadrant spacings that have no or little systematic quadrature error. Thus phase interpolator Resolution for the technique is 90°/128=0.703125° or 279.01785 fs at a 7 GHz clock rate.

In an example, the digital word for the phase interpolator control the position of the 8 output clocks to the samplers. The 4 PI words are offset by 64 from each other to get the 45° offset b/w the phases. This is done by the CDR module in the RXD. The following table shows the codes and expected phase outputs. One of the key requirements is that the multiplexer changes happen only when the mixer does not have any weight on a clock. There are multiple ways to address this quadrant switch. The CDR logic implements the phase interpolator change rules to ensure multiplexer is switched with 0 or 100% weights only. Note the quadrant switching when moving up and down have to ensure the multiplexer change happens before the mixer can enter into the new quadrant. A couple of clock cycles is a good delay between multiplexer switches and code change in the new quadrant.

In an example, due to the binary and thermometer combination in the phase interpolator codes, the phase rotator imposes restrictions on the skew between binary and thermo codes. If the skew is too large, then when a binary-thermo boundary is reached, all the binary will switch early or late to the thermo switch and this can cause a momentary glitch for 1 clock cycle of the rotator (assuming this skew<<1 PI Clock cycle). Due to the 8 phases present, synchronizing the phase interpolator digital code and multiplexer change to the local pi clocks is very difficult and makes the interface quite complex. To avoid this, care is taken in the phase interpolator to be able to asynchronous switch the codes given a certain max skew b/w the codes.

In an example, the simulations show a 5 ps skew can cause a 400 fs momentary glitch during the worst position code switch. The phase interpolator will assume 10 ps for skew between any binary and any thermo code. This skew number is based on digital routing experiments. The phase interpolator also allows for the rotator codes to be jumped by 1 LSB (279 fs), 2 LSB (558 fs), or 4 LSB (1.116 ps) without any special requirements to the rotator. Based on the example table below, we can see that the skew requirements get relaxed in the 2 LSB and 4 LSB cases. When Jumping by 2 LSB case, the code change b/w thermo and binary only happens for Bit B1 and Tx. In case of jumps by 4 LSB, the binary codes stays 00 always when the thermo bits change—hence no skew relationship b/w binary and thermo is forced. At quadrant boundaries, the binary bits go from all 0 to all 1's such that the skew requirement is only between the binary bits. Further details of the present techniques can be found throughout the present specification and more particularly below.

Figure 4:
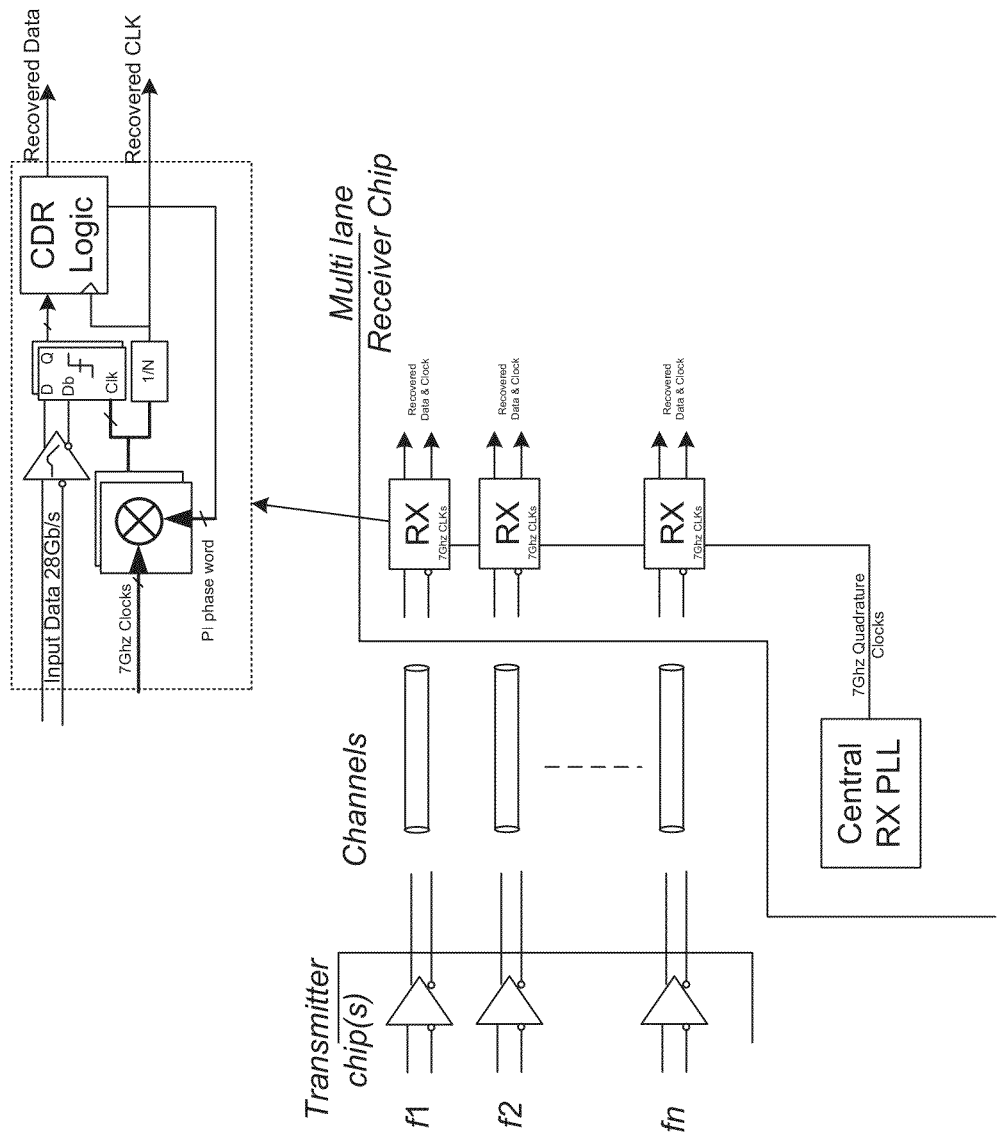
FIG. 4 is a simplified illustration of a phase interpolator device configured in a plurality of receivers for communication channels in a communication integrated circuit device according to an embodiment of the present invention.

FIG. 4 is a simplified illustration of a phase interpolator device configured in a plurality of receivers for communication channels in a communication integrated circuit device according to an embodiment of the present invention. In an example, the present invention provides an integrated transceiver circuit device. The device has a plurality of receivers coupled to a plurality of channels. Each of the channels is configured for transmitting asynchronous data to one of the receivers. Each of the receivers has a pre-amplifier device having an input and an output. The input is coupled to a channel associated with the receiver. The device has a comparator device comprising an input coupled to the pre-amplifier, and configured to identify one or more binary states, and a phase interpolator device coupled to a receiver of the comparator device. The phase interpolator device is configured to perform a digital to phase conversion using information from the one or more binary states. The phase interpolator device comprises a first PI core and a second PI core coupled to the first PI core, a first set of multiplexers coupled to a first input of the first PI core and a second set of multiplexers coupled to second input of the second PI core, and a latch device comprising an set (S) input and a reset R input, the S input being coupled to the second PI core that controls the R input. In an example, the latch device comprises a Y and Y-Bar output. The device also has an input for a digital word, the input being coupled to the first PI core and the second PI core. The device has a clock data recovery (CDR) device coupled to an output of the comparator device and configured to drive the phase interpolator device to synthesize a frequency and phase of a signal from the output. The device has a PLL device, the PLL device being common to and being coupled to each of the phase interpolator devices.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A integrated transceiver circuit device comprising:
a plurality of receivers coupled to a plurality of channels, each of the channels being configured for transmitting asynchronous data to one of the receivers, each of the receivers comprising:
a pre-amplifier device having an input and an output, the input being coupled to a channel associated with the receiver;
a comparator device comprising an input coupled to the pre-amplifier, and configured to identify one or more binary states;
a phase interpolator device coupled to a receiver of the comparator device, the phase interpolator device being configured to perform a digital to phase conversion using information from the one or more binary states; and
a clock data recovery (CDR) device coupled to an output of the comparator device and configured to drive the phase interpolator device to synthesize a frequency and phase of a signal from the output; and
a phase locked loop (PLL) device, the PLL device being common to and being coupled to each of the phase interpolator devices.

2. The device of claim 1 wherein the comparator device comprises a plurality of comparator devices, each of the plurality of comparator devices is coupled to the CDR device, each of the plurality of comparator devices being coupled to a separate phase interpolator device associated with a plurality of phase interpolator devices.

3. The device of claim 1 wherein the phase interpolator device is characterized using a CMOS interpolation that is linear (INL) and is provided to track jitter.

4. The device of claim 1 wherein the phase interpolator device is configured from a CMOS input.

5. The device of claim 1 wherein the one or more binary states consists of a 1, 0, or combinations thereof; wherein the phase interpolator device comprises a first phase interpolator (PI) core and a second PI core, the first PI core is configured to a first set of multiplexers, and the second PI core is configured to a second set of multiplexers, each of the first set of multiplexers and the second set of multiplexers coupled to all four quadrant spaces, the second PI core being configured to control a reset input of an SR latch and provides a rising edge of a complementary clock.

6. The device of claim 1 wherein the plurality of receivers are coupled to a SerDes device, and coupled to a plurality of transmitters; and wherein the phase interpolator device is characterized by a CMOS level on an interpolated output.

7. The device of claim 1 wherein the phase interpolator device comprises a self reset to recondition the input to eliminate cross-bar current in the core during reset; and wherein the phase interpolator device is a digital two phase converter.

8. The device of claim 1 wherein the phase interpolator device is characterized by a phase linearity and a dynamic performance; and wherein the phase interpolator device is characterized by a current based mixing to achieve a substantial linearity in a phase to digital code relationship, wherein the phase interpolator device is configured using a CMOS level and not a CML level.

9. The device of claim 1 wherein the phase interpolator device comprises a pair of mixers configured to mix a first clock and a second clock spaced by 90 Degrees from each other.

10. A phase interpolator device comprising:
    a first phase interpolator (PI) core and a second PI core coupled to the first PI core, the first PI core being configured to interpolate from a first rising edge from a first clock and a second rising edge from a second clock; and the second PI core being configured to interpolate from a third rising edge from a third clock and a fourth rising edge from a fourth clock;
    a first set of multiplexers coupled to a first input of the first PI core and a second set of multiplexers coupled to second input of the second PI core;
    a latch device comprising an set (S) input and a reset R input, the S input being coupled to the second PI core that controls the R input, the latch device comprising a Y and Y-Bar output; and
    an input for a digital word, the input being coupled to the first PI core and the second PI core;
    whereupon the Y and Y-Bar output of the latch device is operably responsive to each rising edge of the S input and the R input to output a clock signal having a fifty percent duty cycle on the Y and Y-Bar output.

11. An integrated transceiver circuit device comprising:
    a plurality of receivers coupled to a plurality of channels, each of the channels being configured for transmitting asynchronous data to one of the receivers, each of the receivers comprising:
        a pre-amplifier device having an input and an output, the input being coupled to a channel associated with the receiver;
        a comparator device comprising an input coupled to the pre-amplifier, and configured to identify one or more binary states;
        a phase interpolator device coupled to a receiver of the comparator device, the phase interpolator device being configured to perform a digital to phase conversion using information from the one or more binary states, the phase interpolator device comprising:
            a first phase interpolator (PI) core and a second PI core coupled to the first PI core;
    a first set of multiplexers coupled to a first input of the first PI core and a second set of multiplexers coupled to second input of the second PI core;
    a latch device comprising an set (S) input and a reset R input, the S input being coupled to the second PI core that controls the R input, the latch device comprising a Y and Y-Bar output; and
    an input for a digital word, the input being coupled to the first PI core and the second PI core; and
        a clock data recovery (CDR) device coupled to an output of the comparator device and configured to drive the phase interpolator device to synthesize a frequency and phase of a signal from the output; and
    a PLL device, the PLL device being common to and being coupled to each of the phase interpolator devices.

12. The device of claim 11 wherein the comparator device comprises a plurality of comparator devices, each of the plurality of comparator devices is coupled to the CDR device, each of the plurality of comparator devices being coupled to a separate phase interpolator device associated with a plurality of phase interpolator devices.

13. The device of claim 11 wherein the phase interpolator device is characterized by a phase linearity and a dynamic performance; and wherein the phase interpolator device is characterized by a current based mixing to achieve a substantial linearity in a phase to digital code relationship, wherein the phase interpolator device is configured using a CMOS level and not a CML level.

14. The device of claim 11 wherein the phase interpolator device is configured with a thermal setting.

15. The device of claim 11 wherein the input for the digital word is coupled to a digital logic generator configured to be asynchronously timed with the digital logic generator and each of the first PI core and the second PI core.

16. The device of claim 15 wherein each of the first PI core and the second PI core is characterized by a resetting characteristic by a reset pulse during a conclusion of a mixing operation.

17. A method of operating a telecommunication device comprising:
    transferring a first clock signal and a second clock signal to a first phase interpolator (PI) core coupled to a second PI core, the first PI core being configured to interpolate from a first rising edge from the first clock signal and a second rising edge from the second clock signal;
    transferring a third clock signal and a fourth clock signal to the second PI core, the second PI core being configured to interpolate from a third rising edge from the third clock signal and a fourth rising edge from the fourth clock signal;
    transferring information from the first PI core to an S input of an SR latch device;
    transferring information from the second PI core to an R input of the SR latch device;
    transferring a digital word to the first PI core and the second PI core; and outputting a clock signal having a fifty percent duty cycle on the Y and Y-Bar from the latch device responsive to each rising edge of the S input and the R input.

18. The method of claim 17 wherein each of the first PI core and the second PI core is characterized by a resetting characteristic by a reset pulse during a conclusion of a mixing operation.

19. The method of claim 17 wherein the input for the digital word is coupled to a digital logic generator configured to be asynchronously timed with the digital logic generator and each of the first PI core and the second PI core.

* * * * *